United States Patent
Huang et al.

(10) Patent No.: US 8,736,391 B2
(45) Date of Patent: May 27, 2014

(54) METHOD TO SHORTEN CRYSTAL OSCILLATOR'S STARTUP TIME

(75) Inventors: Shuiwen Huang, Shanghai (CN); Lin Huang, Shanghai (CN)

(73) Assignee: St-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/519,733

(22) PCT Filed: Dec. 28, 2010

(86) PCT No.: PCT/EP2010/070775
§ 371 (c)(1),
(2), (4) Date: Oct. 10, 2012

(87) PCT Pub. No.: WO2011/080258
PCT Pub. Date: Jul. 7, 2011

(65) Prior Publication Data
US 2013/0141171 A1    Jun. 6, 2013

(30) Foreign Application Priority Data
Dec. 31, 2009    (CN) .......................... 2009 1 0265995

(51) Int. Cl.
*H03B 5/32*    (2006.01)
(52) U.S. Cl.
USPC ................. 331/160; 331/116 R; 331/116 FE; 331/154; 331/158
(58) Field of Classification Search
USPC ............. 331/158, 185, 107 R, 108 R, 116 R, 331/116 FE, 154, 160
See application file for complete search history.

(56) References Cited

U.S. PATENT DOCUMENTS

| | | | |
|---|---|---|---|
| 4,956,618 A | | 9/1990 | Ulmer |
| 5,805,029 A | * | 9/1998 | Theus et al. ............ 331/116 FE |
| 5,923,222 A | * | 7/1999 | Russell et al. ................ 331/185 |
| 6,781,472 B2 | * | 8/2004 | Watanabe ..................... 331/176 |
| 2004/0169562 A1 | | 9/2004 | Novac |
| 2004/0233000 A1 | | 11/2004 | Stevenson |
| 2006/0267704 A1 | * | 11/2006 | Stevenson et al. ............ 331/185 |

FOREIGN PATENT DOCUMENTS

EP    0886372 A2    12/1998
EP    1429451 A1    6/2004

* cited by examiner

*Primary Examiner* — Joseph Chang
*Assistant Examiner* — Jeffrey Shin
(74) *Attorney, Agent, or Firm* — Coats and Bennett PLLC

(57) ABSTRACT

An oscillator circuit includes an amplifier including at least two terminals for receiving a crystal and an automatic amplitude control loop coupled to the amplifier including biasing circuitry switched between a first operational mode and a second operational mode. The first operational mode occurs during an initial time period and the second operational mode occurs after the initial time period is expired. The biasing circuitry includes first and second PMOS transistor circuits, each transistor circuit including an unswitched PMOS transistor and a switched PMOS transistor. Alternatively, the biasing circuitry can include first and second NMOS transistor circuits, each transistor circuit including an unswitched NMOS transistor and a switched NMOS transistor. The biasing circuitry is under control of an internally generated control signal.

20 Claims, 3 Drawing Sheets

METHOD TO SHORTEN CRYSTAL OSCILLATOR'S STARTUP TIME

BACKGROUND OF THE INVENTION

The present invention is related to crystal oscillators and more particularly a method for decreasing the oscillator startup time.

At the present time, a 32,768 Hz clock signal is used in most portable applications using a crystal oscillator. These applications require a crystal oscillator circuit that has high phase noise performance and a low startup time.

Traditional pierce crystal oscillator typically use an Automatic Amplitude Control loop (AAC) to keep the amplitude constant with process and temperature. However, the control loop is always ON and injects noise around clock edges. This means that the AAC noise dominates the phase noise of the pierce crystal oscillator. To increase phase noise performance, typical designs often set the transconductance of a bias transistor larger than the tail current of the amplifier to decrease the noise impact from the bias circuit. However, this will decrease the open loop gain of the AAC that leads to a longer the startup time.

What is desired is a circuit and method to decrease the crystal oscillator startup time while maintaining good phase noise performance.

SUMMARY OF THE INVENTION

According to the present invention, a circuit and method to shorten a crystal oscillator's startup time at the same time keeps the same phase noise performance as that obtained with prior art circuits. In the method and circuit of the present invention internal control signals are used to control a bias circuit.

To shorten the oscillator startup time, the open loop gain of AAC (Automatic Amplitude Control) needs to be increased when the oscillator begins oscillating. But, to keep the phase noise performance, the transconductance (gm) of the bias transistor should be made larger than the tail current transistor from small to large that will shorten the startup time and keep the phase noise performance acceptable.

In the present invention, a control signal created by an internal circuit is used to shorten the startup time. At the first step, the oscillator starts at fast speed and low phase noise state. At the second step, the control signal is changed and oscillator goes to high phase noise state by spending a little more oscillating time. The internal control circuit consumes very low quiescent current. The method of the present invention shortens approximately 20% of the start up time while keeping acceptable phase noise performance.

The crystal oscillator of the present invention has fast startup, stable phase noise performance, and uses an internally generated control signal.

DETAILED DESCRIPTION

Figure 1:
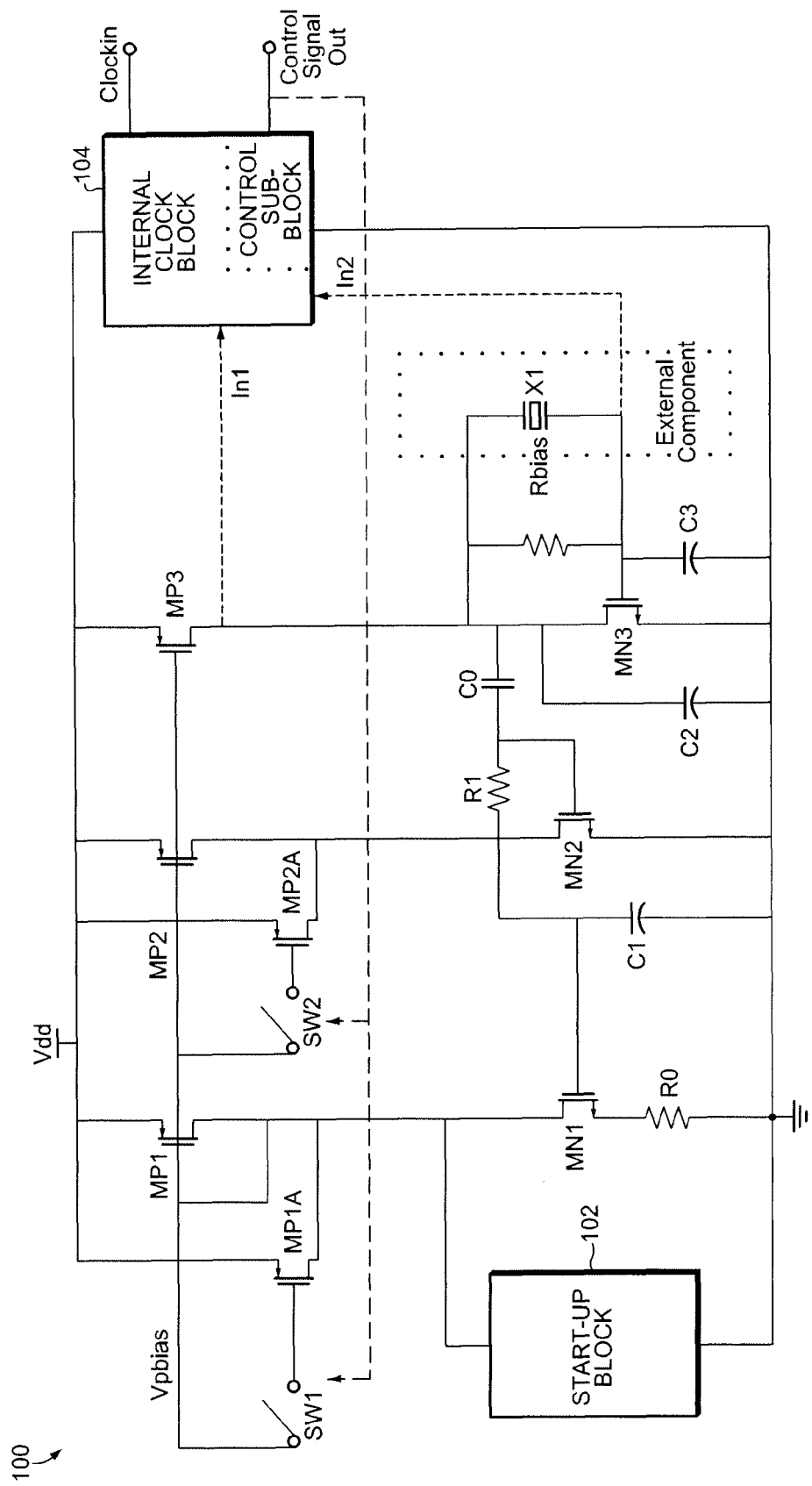
FIG. 1 is a schematic diagram of an oscillator circuit according to a first embodiment of the invention.

Referring now to FIG. 1 a first embodiment of an oscillator circuit 100 according to the present invention comprises an amplifier, an AAC loop, a startup circuit 102, an internal clock block 104 including a control signal block, as well as controlled switches and transistors. The Pierce crystal oscillator circuit 100 further comprises a crystal (X1, which is generally an external component), load capacitors (C2 coupled to the drain of transistor MN3 and C3 coupled to the gate of transistor MN3), and a bias resistor (Rbias) across the crystal.

The amplifier includes transistors MN3 and MP3. The AAC loop includes transistors MN1, MN2, MP1 (and MP1A), MP2 (and MP2A), R0, Co, R1 and C1. Capacitor C0 is a DC-blocking capacitor, which couples the oscillating signal from the drain of transistor MN3. The combination of resistor R1 and capacitor C1 is a low-pass filter. A self bias circuit is formed by transistors MN1, MN2, MP1, MP2 and resistor R0. The bias transistor is split up into two parts by a switch. Transistors MP1 and MP1A are split by switch SW1. Transistors MP2 and MP2A are split by switch SW2. The signal Vpbias refers to the bias voltage at the gates of transistors MP1, MP2, and MP3. The sources of transistors MP1, MP1A, MP2, MP2A, and MP3 are all coupled to a source of power supply voltage, Vdd. The sources of transistors MN1, MN2, and MN3 are all coupled to ground. The source of transistor MN1 is coupled to ground through resistor R0, whereas the source of transistors MN2 and MN3 are coupled directly to ground.

When oscillator 100 starts oscillating, the signal coupled by capacitor C0 enters the AAC loop. If the amplitude of the signal becomes large, the AAC loop controlling the gate of transistor MP3 will decease the current of transistor MP3, thus deceasing the amplitude of oscillating signal In1. If the amplitude of the signal becomes small, the AAC loop controlling the gate of transistor MP3 will increase the current MP3, thus increasing the amplitude of oscillating signal In1.

The startup circuit 102 is of conventional design and provides the startup current for oscillator 100 when circuit's power is turned on. Startup circuit 102 plays a significant role for the bias circuit. Startup circuit 102 takes the bias circuit from a dead (zero current) operating point to its normal operating point and then is no longer used once the bias circuit starts operating properly.

The internal 32768 Hz clock signal is created by an internal clock block 104 with input signals In1 and In2 from the drain of transistor MN3 or the gate of transistor MN2 or both of them. The control signal ("Control Signal Out") is created by a control sub-block.

Figure 3:
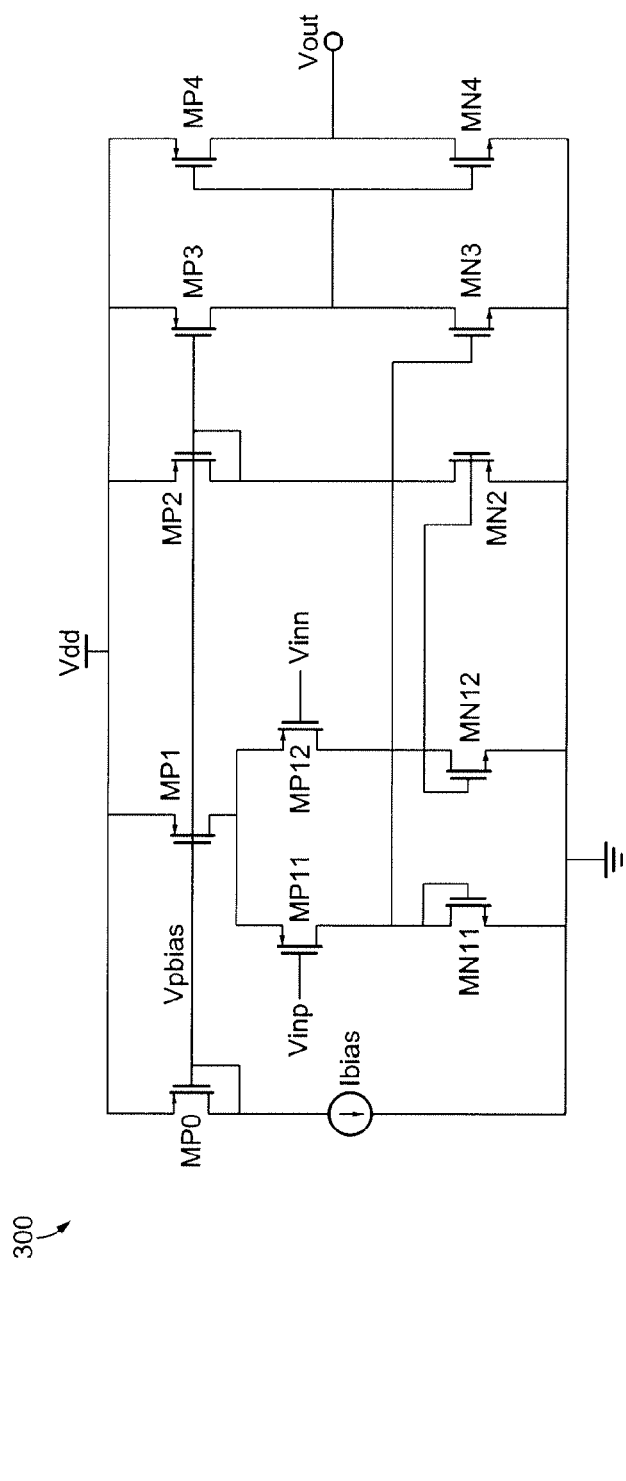
FIG. 3 is a schematic diagram of the internal clock block, which includes a comparator for receiving a sinusoidal clock signal and generating a square wave clock signal.
Figure 4:
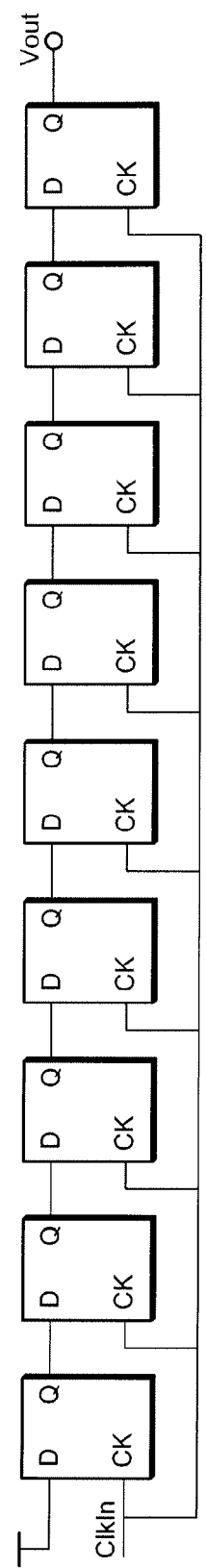
FIG. 4 is a schematic diagram of a control sub-block that generates a control signal according to the present invention.

The internal clock block 300 is shown in FIG. 3 and includes a conventional comparator that converts the sinusoidal clock signal to a square wave signal. The digital sub-block 400 is shown in FIG. 4 and provides the clock ready signal. The clock ready signal control switches SW1 and SW2.

Referring now to FIG. 3, internal clock 300 includes a conventional comparator including a differential input pair MP11 and MP12 for receiving the input differential signal Vinp/Vinn. Two capacitor-connected transistors MN11 and MN12 provide the load for generating a differential output signal received by transistors MN2 and MN3. Transistor MN3 generates an output signal that is buffered by output transistors MP4 and MN4 to generate the Vout output signal. A bias current Ibias is used to supply the biasing circuitry including diode-connected transistor MP0 coupled to biasing transistors MP1, MP2, and MP3.

Referring now to FIG. 4, the schematic of the digital sub-block 400 is shown, which is includes a plurality of seriallyconnected D-type flip flops in which the Q output of a previous stage is coupled to the D input of a subsequent stage. The CK clock inputs are all coupled together for receiving the ClkIn input signal. The D input of a first stage is coupled to the power supply voltage, and the Q output of a last stage provides the Vout output signal for generating the control signal according to the present invention.

When the control signal is at a logic zero, the switches SW1 and SW2 are in an off state. In this first mode of operation, the parallel transistors (MP1A and MP2A) are not connected to the AAC loop and the gain of the loop is comparably larger, which leads to fast oscillating. When the control signal is at a logic one, the switches SW1 and SW2 are in an on state. In this second mode of operation, the parallel transistors MP1A and MP2A are connected to the AAC loop. This decreases the noise from the bias transistors because the width (and/or transconductance) becomes larger. This means that the crystal oscillator 100 regains acceptable phase noise performance, equivalent to that provided by a circuit having combined transistors MP1/MP1A and MP2/MP2A. Therefore, by splitting the bias transistors into two parts and controlling the state of the two part states, oscillator startup time may be shortened while keeping acceptable phase noise performance.

Figure 2:
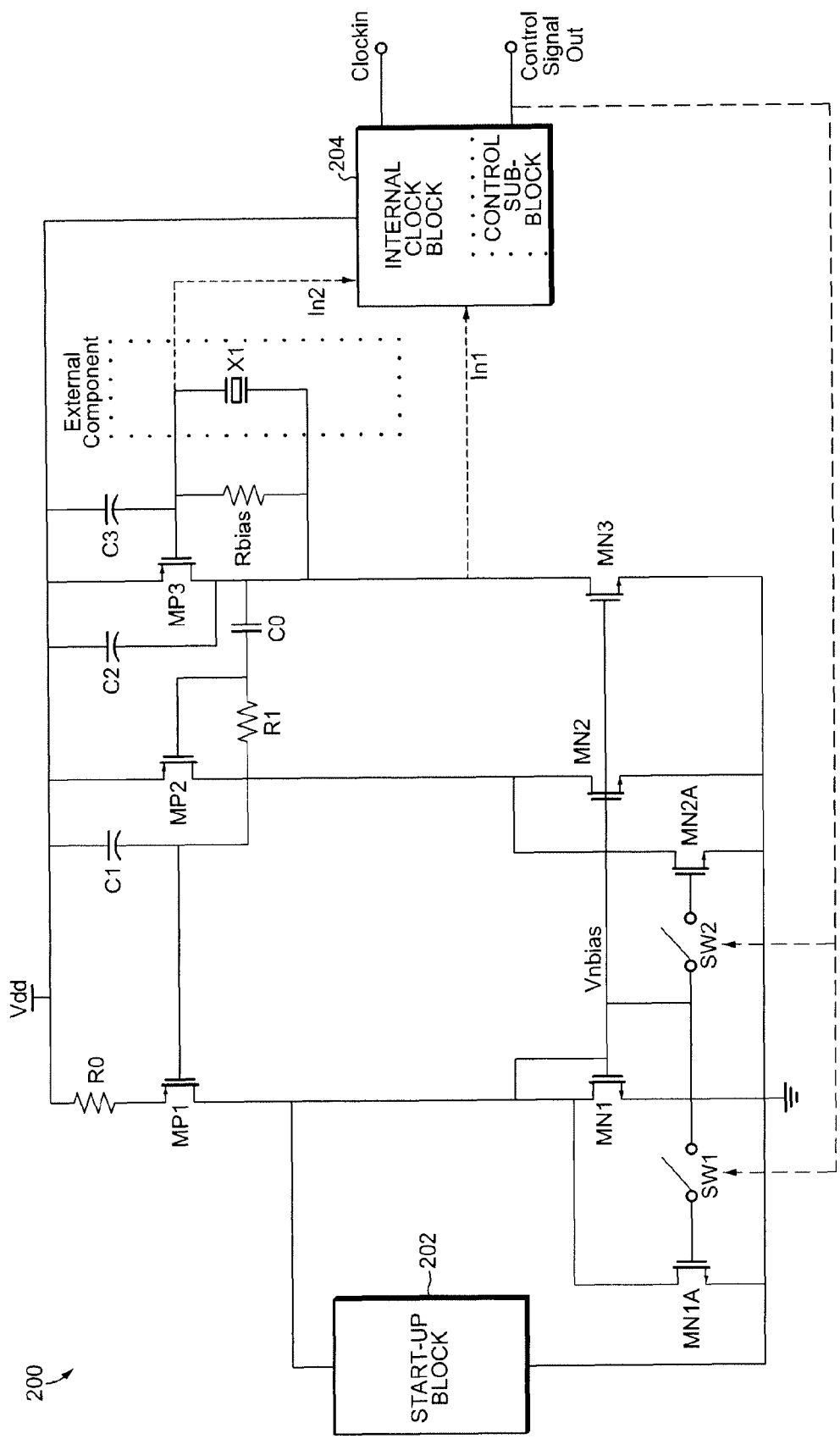
FIG. 2 is a schematic diagram of an oscillator circuit according to a second embodiment of the invention.

Referring now to FIG. 2 a second embodiment of an oscillator circuit 200 according to the present invention comprises an amplifier, an AAC loop, a startup circuit 202, an internal clock block 204 including a control signal block, as well as controlled switches and transistors. The Pierce crystal oscillator circuit 200 further comprises a crystal (X1, which is generally an external component), load capacitors (C2 coupled to the drain of transistor MP3 and C3 coupled to the gate of transistor MP3), and a bias resistor (Rbias) across the crystal.

The amplifier includes transistors MN3 and MP3. The AAC loop includes transistors MN1 (and MN1A), MN2 (and MN2A), MP1, MP2, R0, Co, R1 and C1. Capacitor C0 is a DC-blocking capacitor, which couples the oscillating signal from the drain of transistor MN3. The combination of resistor R1 and capacitor C1 is a low-pass filter. A self bias circuit is formed by transistors MN1, MN2, MP1, MP2 and resistor R0. The bias transistor is split up into two parts by a switch. Transistors MN1 and MN1A are split by switch SW1. Transistors MN2 and MN2A are split by switch SW2. The signal Vnbias refers to the bias voltage at the gates of transistors MN1, MN2, and MN3. The sources of transistors MN1, MN1A, MN2, MN2A, and MN3 are all coupled to ground. The sources of transistors MP1, MP2, and NP3 are all coupled to the source of power supply voltage, Vdd. The source of transistor MP1 is coupled to Vdd through resistor R0, whereas the source of transistors MP2 and MP3 are coupled directly to Vdd.

When oscillator 200 starts oscillating, the signal coupled by capacitor C0 enters the AAC loop. If the amplitude of the signal becomes large, the AAC loop controlling the gate of transistor MP3 will decease the current of transistor MP3, thus deceasing the amplitude of oscillating signal In1. If the amplitude of the signal becomes small, the AAC loop controlling the gate of transistor MP3 will increase the current MP3, thus increasing the amplitude of oscillating signal In1.

The startup circuit 202 is of conventional design and provides the startup current for oscillator 200 when circuit is power is turned on. Startup circuit 202 plays a significant role for the bias circuit. Startup circuit 202 takes the bias circuit from a dead (zero current) operating point to its normal operating point and then is no longer used once the bias circuit starts operating properly.

The internal 32768 Hz clock signal is created by an internal clock block 204 with input signals In1 and In2 from the gate of transistor MP3 or the drain of transistor MN3 or both of them. The control signal ("Control Signal Out") is created by a control sub-block. The circuitry of block 204 and the control sub-block have been previously described with respect to FIGS. 3 and 4.

When the control signal is at a logic zero, the switches SW1 and SW2 are in an off state. In this first mode of operation, the parallel transistors (MN1A and MN2A) are not connected to the AAC loop and the gain of the loop is comparably larger, which leads to fast oscillating. When the control signal is at a logic one, the switches SW1 and SW2 are in an on state. In this second mode of operation, the parallel transistors MN1A and MN2A are connected to the AAC loop. This decreases the noise from the bias transistors because the width (and/or transconductance) becomes larger. This means that the crystal oscillator 100 regains acceptable phase noise performance, equivalent to that provided by a circuit having combined transistors MN1/MN1A and MN2/MN2A. Therefore, by splitting the bias transistors into two parts and controlling the state of the two part states, oscillator startup time may be shortened while keeping acceptable phase noise performance.

In a third embodiment of the invention, the circuit shown in FIG. 1 can be "flipped" as is known in the art, wherein the PMOS and NMOS transistors are swapped, the polarities of the signals changed, and the power and ground rails are switched.

In a fourth embodiment of the invention, the circuit shown in FIG. 2 can also be "flipped" as is known in the art, wherein the PMOS and NMOS transistors are swapped, the polarities of the signals changed, and the power and ground rails are switched.

While the oscillator can be used as desired to provide an oscillator circuit with quick startup time and acceptable phase noise performance, particular application can be realized in PLL circuits in, for example, HDMI applications.

Having described and illustrated the principle of the invention in a preferred embodiment thereof, it is appreciated by those having skill in the art that the invention can be modified in arrangement and detail without departing from such principles. Although a preferred method and embodiments have been shown, the exact details of the preferred method of the present invention can be changed as desired as required for a particular application. We therefore claim all modifications and variations coming within the spirit and scope of the following claims.

We claim:

1. An oscillator circuit comprising:
   an amplifier including at least two terminals for receiving a crystal; and
   an automatic amplitude control loop coupled to the amplifier comprising biasing circuitry switched between a first operational mode and a second operational mode;
   wherein, in both the first operational mode and the second operational mode, the automatic amplitude control loop has a non-zero gain that causes the oscillator circuit to oscillate;
   wherein the biasing circuitry comprises first and second PMOS transistor circuits, each transistor circuit comprising an unswitched PMOS transistor and a switched PMOS transistor.

2. The oscillator circuit of claim 1 wherein the first operational mode occurs during an initial time period and the second operational mode occurs after the initial time period is expired.

3. An oscillator circuit comprising:
- an amplifier including at least two terminals for receiving a crystal; and
- an automatic amplitude control loop coupled to the amplifier comprising biasing circuitry switched between a first operational mode and a second operational mode;
- wherein, in both the first operational mode and the second operational mode, the automatic amplitude control loop has a non-zero gain that causes the oscillator circuit to oscillate;
- wherein the biasing circuitry comprises first and second NMOS transistor circuits, each transistor circuit comprising an unswitched NMOS transistor and a switched NMOS transistor.

4. The oscillator circuit of claim 3 wherein the first operational mode occurs during an initial time period and the second operational mode occurs after the initial time period is expired.

5. An oscillator comprising:
- first, second, and third PMOS transistors having a common gate connection;
- a first switching transistor coupled to the first PMOS transistor;
- a second switching transistor coupled to the second PMOS transistor; and
- first, second, and third NMOS transistors coupled to the first, second, and third PMOS transistors;
- wherein the third NMOS transistor has two terminals for receiving an external crystal;
- wherein the first and second PMOS transistors, the first and second switching transistors, and the first and second NMOS transistors comprise an automatic amplitude control loop;
- wherein the first and second switching transistors are switched between a first operational mode and a second operational mode;
- wherein, in both the first operational mode and the second operational mode, the automatic amplitude control loop has a non-zero gain that causes the oscillator circuit to oscillate.

6. The oscillator of claim 5 wherein the first switching transistor comprises a PMOS transistor having a gate coupled to a switch.

7. The oscillator of claim 5 wherein the second switching transistor comprises a PMOS transistor having a gate coupled to a switch.

8. The oscillator of claim 5 wherein the first, second, and third PMOS transistors each comprise a source coupled to a supply voltage.

9. The oscillator of claim 5 wherein the first, second, and third NMOS transistors each comprise a source coupled to ground.

10. The oscillator of claim 5 wherein the first and second NMOS transistors are coupled together through a low pass filter.

11. The oscillator of claim 5 wherein the second and third NMOS transistors are coupled together through a capacitor.

12. The oscillator of claim 5 further comprising a control circuit for providing a switching control circuit to the first and second switching transistors.

13. An oscillator comprising:
- first, second, and third PMOS transistors;
- first, second, and third NMOS transistors having a common gate connection coupled to the first, second, and third PMOS transistors;
- a first switching transistor coupled to the first NMOS transistor; and
- a second switching transistor coupled to the second NMOS transistor;
- wherein the third PMOS transistor has two terminals for receiving an external crystal;
- wherein the first and second PMOS transistors, the first and second switching transistors, and the first and second NMOS transistors comprise an automatic amplitude control loop;
- wherein the first and second switching transistors are switched between a first operational mode and a second operational mode;
- wherein, in both the first operational mode and the second operational mode, the automatic amplitude control loop has a non-zero gain that causes the oscillator circuit to oscillate.

14. The oscillator of claim 13 wherein the first switching transistor comprises an NMOS transistor having a gate coupled to a switch.

15. The oscillator of claim 13 wherein the second switching transistor comprises an NMOS transistor having a gate coupled to a switch.

16. The oscillator of claim 13 wherein the first, second, and third PMOS transistors each comprises a source coupled to a supply voltage.

17. The oscillator of claim 13 wherein the first, second, and third NMOS transistors each comprises a source coupled to ground.

18. The oscillator of claim 13 wherein the first and second PMOS transistors are coupled together through a low pass filter.

19. The oscillator of claim 13 wherein the second and third PMOS transistors are coupled together through a capacitor.

20. The oscillator of claim 13 further comprising a control circuit for providing a switching control circuit to the first and second switching transistors.

* * * * *